United States Patent [19]

Dorey

[11] E Re. 28,706

[45] Reissued Feb. 3, 1976

[54] TRIPLE-SLOPE ANALOG-TO-DIGITAL CONVERTERS

[75] Inventor: Howard Anthony Dorey, Godalming, England

[73] Assignee: The Solartron Electronic Group Limited, Farnborough, England

[22] Filed: May 23, 1975

[21] Appl. No.: 580,401

Related U.S. Patent Documents

Reissue of:

[64] Patent No.: 3,737,892
Issued: June 5, 1973
Appl. No.: 232,883
Filed: Mar. 8, 1972

U.S. Applications:

[62] Division of Ser. No. 764,790, Oct. 2, 1968.

[30] Foreign Application Priority Data

Oct. 27, 1967 United Kingdom ..... 48988/67

[52] U.S. Cl. . 340/347 NT; 340/347 AD; 324/99 D; 235/150.51

[51] Int. Cl.[2] ..... H03K 13/02; H03K 13/20

[58] Field of Search ..... 340/347 NT, 347 AD; 324/99 D; 235/150.51

[56] References Cited

UNITED STATES PATENTS

| | | | |
|---|---|---|---|
| 3,296,613 | 1/1967 | Andersen et al. | 340/347 NT |
| 3,313,924 | 4/1967 | Schulz et al. | 235/150.51 |
| 3,316,547 | 5/1967 | Ammann | 340/347 NT |
| 3,480,948 | 11/1969 | Lord | 340/347 NT |
| 3,564,538 | 2/1971 | Bondzeit et al. | 340/347 NT |
| 3,577,140 | 5/1971 | Aasnaes | 340/347 AD |

*Primary Examiner*—Thomas J. Sloyan
*Attorney, Agent, or Firm*—William R. Sherman; Kevin McMahon

[57] ABSTRACT

A ramp type analogue to digital converter including an integrating circuit the output of which is first set to a level dependent upon the magnitude of an analogue input voltage to be converted. A reference signal is then applied to ramp down the integrator output level to a datum level and the conversion is effected by counting clock pulses while the integrator output is ramping down to datum level. The magnitude of the reference signal and the numerical weighting of the clock pulses being counted are scaled down by a common factor when the ramp reaches a value close to the datum level so that the slope of the ram is reduced and the resolution of conversion is increased as it approaches datum. Thus, compared with a ramp type digital voltmeter having a constant slope discharge ramp and a given resolution, the discharge time is reduced for the same resolution of conversions.

4 Claims, 7 Drawing Figures

TRIPLE-SLOPE ANALOG-TO-DIGITAL CONVERTERS

Matter enclosed in heavy brackets [ ] appears in the original patent but forms no part of this reissue specification; matter printed in italics indicates the additions made by reissue.

This is a division of application Ser. No. 764,490 filed Oct. 2, 1968.

This invention related to analogue to digital (a-to-d) converters of the type in which the conversion involves measuring the duration of a ramp function voltage derived from an integrating means, an integrating amplifier for example. The digital conversion is effected by counting clock pulses during the ramp. Such a-to-d converters are used often as digital voltmeters. Typically the integrating means is charged to a value dependent upon the input voltage to be converted and then discharged at a constant rate to a datum level. Examples of such a-to-d converters are to be found in Huskey & Korn "Computer Handbook" McGraw Hill 1962 pages 18–35 and FIG. 18.55 and the specifications of our British Pat. No. 1,058,501 (U.S. Pat. application Ser. No. 449,809 filed Apr. 21, 1965) and [U.S.] *British* Pat. application Ser. No. 9743/67(U.S. Pat. application Ser. No. 708,652 filed Feb. 27, 1968), which patents and applications are assigned to the same assignee as the instant application.

The counting of the clock pulses is arranged to start simultaneously with the initiation of the discharging ramp and must be terminated when the ramp reaches datum level. Consequently for high resolution of conversion it is extremely important to detect the exact moment when the ramp reaches datum level.

According to the invention there is provided a ramp type analog to digital converter comprising an integrating means, means for charging the integrating means to a level dependent upon the magnitude of an input signal to be converted, means for applying a reference signal to the integrating means to discharge the integrating means to a datum level and thereby generate a ramp function voltage, means for causing clock pulses to be counted by a counter during an interval commencing with the application of the reference signal means arranged to scale down the reference signal and the numerical weight with which the clock pulses are counted by a common factor when the ramp reaches a value close to the datum level and means for subsequently detecting when the ramp reaches datum level to stop the counting of the pulses. Thus the slope of the ramp is reduced during a latter part of the said interval commencing when the ramp reaches the value close to datum level and terminating when the ramp reaches datum level. The reference signal may be provided by a voltage, current or charge source. The value close to the datum level may be above or below the datum level; in the latter case the polarity of the reference signal must be reversed and pulses must be subtracted from the counter during the latter part of the ramp.

If the pulses are counted by a decade counter or a binary counter it is convenient to scale down the reference signal by a factor of $10^{(n-1)}$ for the decade counter or $2^{(n-1)}$ for the binary counter, where n is a positive integer, and to scale down the weighting of the clock pulses by feeding constant rate pulses to the $n^{th}$ stage of the counter during the first part of the ramp and to the first stage during the latter part of the ramp.

Compared with a known ramp type a-to-d converter having a constant-slope discharge ramp, a converter according to the present invention can, in one aspect, be so designed that the slope of the latter part of the ramp is the same as that of the known converter. Such a converter would have the same resolution as the known converter but a higher conversion rate. For example, consider a known converter having a decade counter capable of counting up to a maximum of 19,999, a clock-pulse frequency f, and a reference source of magnitude $V_R$. To convert a full scale input voltage would require a time interval equal to 19,999/f. If a converter having the same counter capability and clock pulse frequency had reference signals of magnitude $10V_R$ and $V_R$ applied to discharge the integrating means during the first and latter parts respectively of the ramp while clock pulses were fed into the second and first decades of the counter during the first and latter parts respectively of the discharge ramp, the discharge time would be reduced to (1,999 + 9)/f, that is 2,008/f, with no reduction in the resolution of the conversion. This discharge time is almost 20 times less than that of the known converter.

Similarly, if the reference signal were increased to $100V_R$ and the clock pulses fed into the third decade during the first part of the discharge ramp, it can be shown that the discharge time would be almost 70 times less than that of the known converter.

If a reduction in the resolution of conversion can be tolerated then the discharge time can be reduced still further. The relatively high conversion rates which can be obtained with a-to-d converters according to the present invention make them particularly suitable for incorporation in high-speed data-logging systems which often require conversions in excess of 10,000 per second.

In another aspect of the invention the slope of the latter part of the ramp can be reduced to increase the resolution of the converter. This aspect would find applications in high accuracy, high resolution digital voltmeters in which the speed of conversion is of lesser importance.

The invention will be described in more detail, by way of example, with reference to the accompanying drawings, in which.

Figure 1:
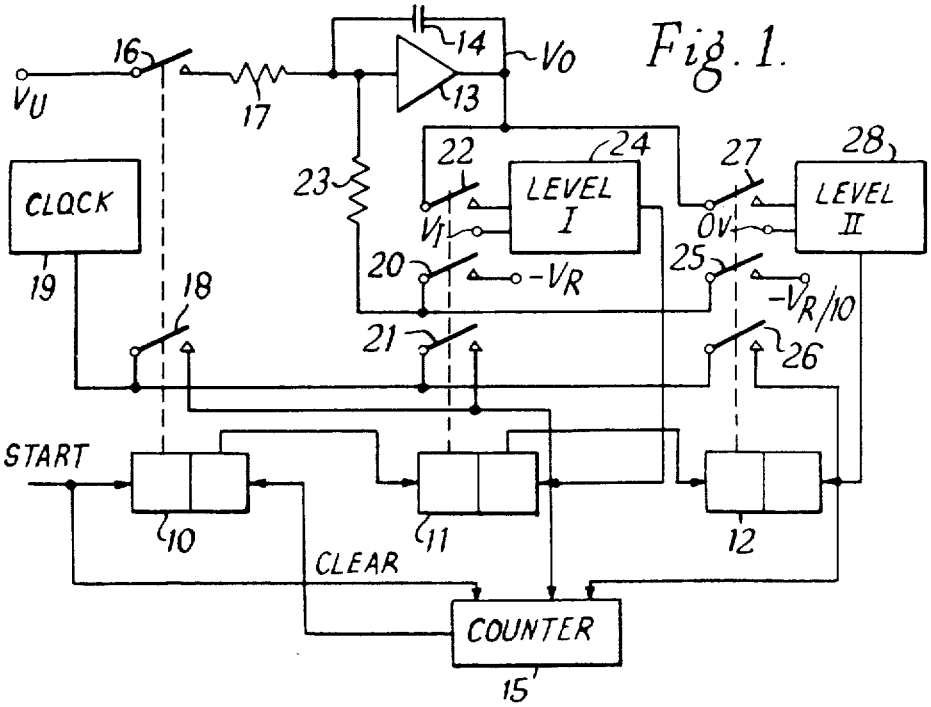
FIG. 1 is a block diagram of one embodiment.

In FIG. 1 three bistable circuits 10, 11 and 12 have been shown as controlling the various stages of operation in order to facilitate a clear description, the bistable circuits controlling various switches. In practice the logic employed may be rather different and naturally semi-conductor switches such as transistor or field-effect transistors F.E.T.'s or other electronic gating devices will be used rather than the mechanical switches shown.

The first stage of operation involves applying an input voltage $V_U$ to be converted to the input of an operational amplifier 13 having a feedback capacitor 14 to form an integrating circuit for a predetermined length of time to charge the capacitor 14. To this end the bistable circuit 10 is set by a START signal which also clears a decade counter 15.

The START signal may be derived from the 60 Hz power line frequency by shaping the sinusoidal waveform and dividing it by two to provide a 30 Hz square wave which is used to set the bistable 30 times per second.

The bistable circuit 10 closes a switch 16 to apply the voltage $V_U$ to the amplifier through a resistor 17 and also closes a switch 18 through which pulses pass from a clock source 19 to the second decade of the counter 15. With the switch 16 closed the output level $V_o$ of the amplifier 13 ramps up from a datum level at a rate dependent upon the magnitude of the voltage $V_U$. The clock source may be an astable multivibrator.

When the counter overflows the bistable circuit 10 is reset, the switches 16 and 18 open and the bistable circuit 11 is set to initiate the next stage of operation.

At the end of the first stage, of fixed duration T (FIG. 2) the output $V_o$ of the amplifier 13 has risen from a datum level, to a value $V_o$ max. proportional to $V_U$. The datum level may conveniently be zero volts. The clock-pulse frequency and the capacity of the counter are usually so arranged that the duration T of the first stage of operation when the integrator is being charged is made equal to one or more periods of the lower line frequency.

The bistable circuit 11 closes switches 20, 21 and 22. The switch 20 applies a reference voltage $V_R$ of opposite polarity to that of the input voltage, $V_U$ to the amplifier 13 through a resistor 23 in order to discharge the amplifier at a relatively rapid rate. The switch 21 feeds clock pulses to the second decade of the counter 15, which starts to count up from zero. The switch 22 connects the output $V_o$ of the amplifier to a first level detector 24 which operates when $V_o$ has returned to a slightly positive level $V_I$ (FIG. 2) to reset the bistable circuit 11. The bistable circuit 11, then opens the switches 20, 21 and 22 and sets the bistable circuit 12 to initiate the final stage of operation.

In the final stage the ramp voltage $V_o$ completes its return to zero at a rate $1/10^{th}$ that of its former rate. To this end the bistable circuit 12 closes swithces 25, 26 and 27. The switch 25 applies a scaled down reference voltage $V_R/10$ to the resistor 23, the switch 26 supplies clock pulses to the first decade of the counter 15 and switch 27 connects the amplifier output to a second level detector 28 which operates at datum level (FIG. 2) to reset the bistable circuit 12 and terminate the conversion. The number now in the counter 15 is proportional to the input voltage $V_U$.

The level detectors 24 and 28 can be differential amplifiers and may conveniently be integrated-circuit differential comparator amplifiers such as those supplied by Fairchild under type No. $\mu$A710. The detector 24 would have one input connected to a voltage of magnitude $V_I$ and the other input to the switch 22. Similarly the detector 28 would have one input connected to zero volts and the other to the switch 27.

The use of two level detectors 24 and 28 is not essential. If a single level detector is connected to the amplifier output a switch can be used to add an increment of voltage $V_I$ to the voltage $V_o$ as an offset during the second stage only. At the end of this stage $V_I$ is removed and $V_o$ continues at the slower rate to zero. The effect of an offset can also be obtained by feeding a small unit of charge or current into the integrating amplifier at some time during the first and second stages. Then when $V_o$ has reached zero at the end of stage two the unit of charge is removed again causing $V_o$ to rise to $V_I$ from whence it then returns in the third stage to zero at the slower rate.

Figure 4:
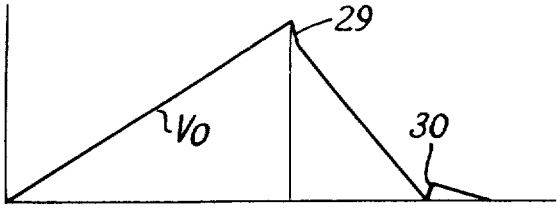
FIG. 4 shows a waveform illustrating the operation of the embodiment of FIG. 3.
Figure 3:
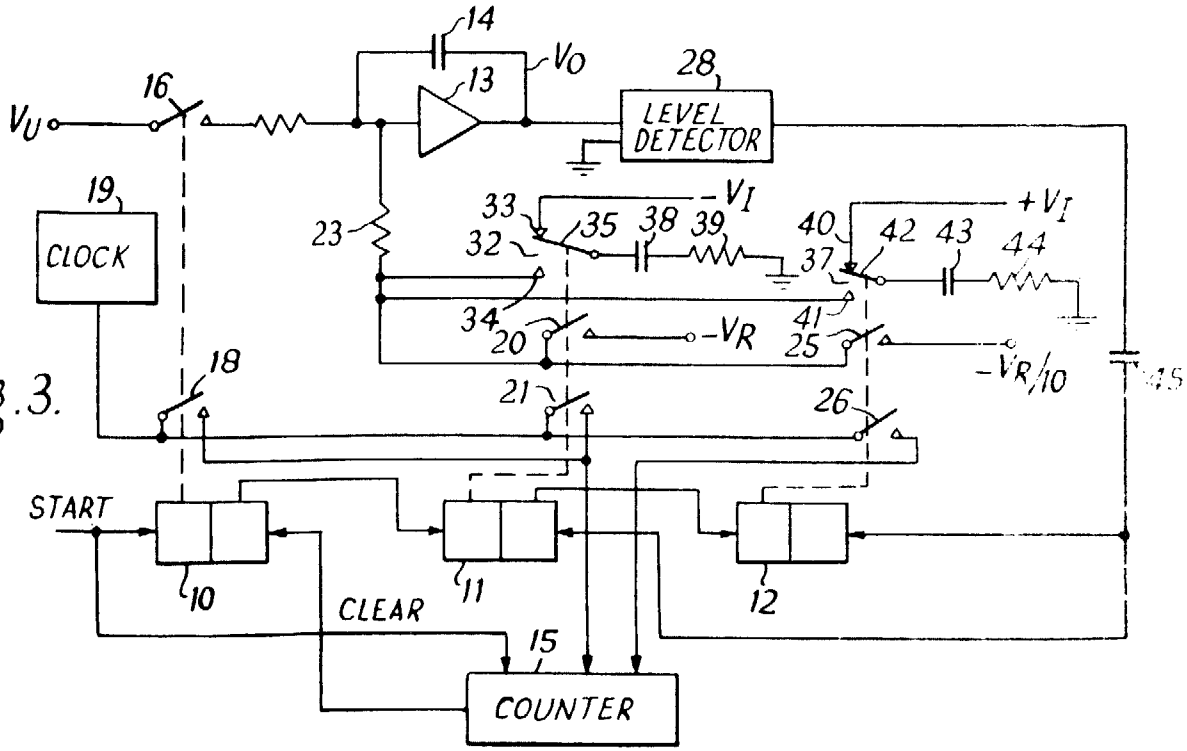
FIG. 3 shows a modification of the embodiment of FIG. 1.

This latter embodiment is shown in FIG. 3 and its mode of operation is illustrated in FIG. 4. In FIG. 3 the input of the level detector 28 is connected permanently to the output of the amplifier 13 and the output is connected to the reset input of both bistable circuits 11 and 12. Change-over switches 32 and 37 are substituted for the switches 22 and 27 of FIG. 1. The switch 32 has a normally-closed contact 33 connected to a source of voltage $-V_I$, a normally-open contact 34 connected to the resistor 23 and a changeover contact 35 connected through a capacitor 38 and resistor 39 to earth. The resistor is provided merely to limit the capacitor charging current when the contact 35 is moved to the position shown. The switch 32 is operated with the switches 20 and 21 by the bistable circuit 11 and causes the capacitor 38 to discharge into the amplifier through the resistor 23 thus reducing the amplitude of $V_o$ by a small amount as shown at 29 in FIG. 4.

The switch 37 has a normally-closed contact 40 connected to a source of voltage $+V_I$, normally-open contact 41 connected to the resistor 23 and a change-over contact 42 connected through a capacitor 43 and a current-limiting resistor 44 to earth. The switch 37 is operated with the switches 25 and 26 by the bistable circuit 12. The values of the capacitors 38 and 43 and the resistors 39 and 44 are made equal. When $V_o$ has reached zero volts at the end of stage two the level detector 28 provides an output to reset the bistable circuit 11 which then sets the bistable circuit 12. The switch 37 changes over and the capacitor 43 discharges into the integrating amplifier and $V_o$ rises from zero to $V_I$ as shown at 30 in FIG. 4. The ramp then continues to discharge towards zero at the slower rate defined by $V_R/10$. The output of the level detector 28 is a.c. coupled to the bistable circuits 11 and 12 through a capacitor 45 to ensure that the bistable circuit 12 is reset by the level detector 28 only at the end of the third stage.

Figure 6:
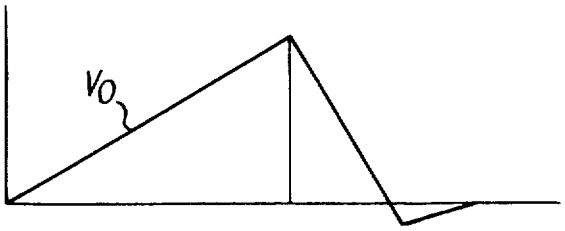
FIG. 6 shows a waveform illustrating the operation of the embodiment of FIG. 5.
Figure 5:
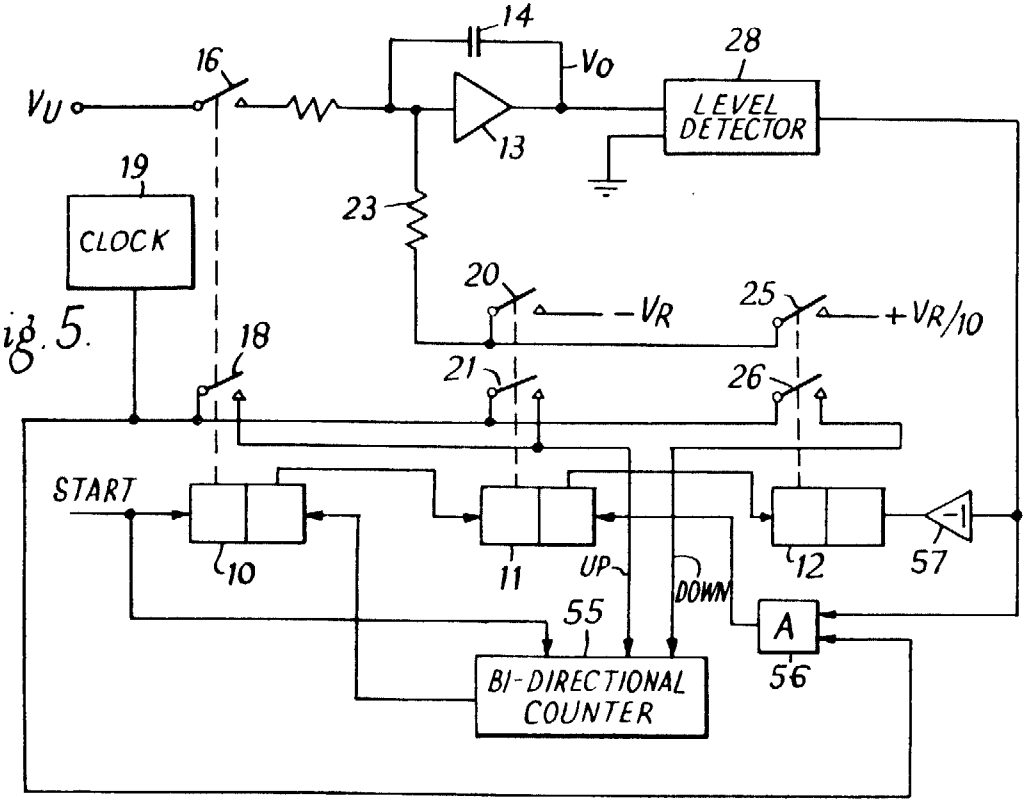
FIG. 5 shows a further modification of the embodiment of FIG. 1.

A second modification of FIG. 1 is shown in FIG. 5 in which the switches 22 and 27 are dispensed with. When $V_o$ first reaches zero, it is allowed to overshoot and in the third stage switch 25 connects $+V_R/10$ to the resistor 23 and the switch 26 connects the clock source to a subtractive input on the first decade of a bidirectional counter 55. The appropriate waveform is shown in FIG. 6. When the overshoot occurs, the ramp is stopped by the occurrence of the next clock pulse from the clock pulse generator 19. To achieve this the outputs from the clock pulse source 19 and the detector 28 are connected to the inputs of an AND gate 56, the output of which is connected to the reset input of the bistable circuit 11. The output from the level detector 28 is connected to the reset input of the bistable circuit 12 through an inverter 57 to ensure that the bistable circuit is reset by the level detector only at the end of the third stage. As an alternative to a bi-directional counter, a uni-directional counter can be used with the output of the first decade wire to give the complement of the true count. This assumes that not more than ten pulses have to be counted in the third stage.

In any of the above systems a pulse generator capable of generating pulses of defined magnitude and duration could be used in place of the reference voltage source $V_R$. The pulse generator could be for example an astable multivibrator or a monostable multivibrator triggered by the clock pulses. It would also be necessary to provide a divider circuit (÷ 10 in the embodiments described) to scale down the pulses during the latter part of the discharge ramp.

Whilst the invention has been described which is an improvement to the dual ramp type of a-to-d converter in which the voltage to be converted is applied to the input of an integrating amplifier for a fixed period of time defined by counting a pre-determined number of clock pulses other means for charging the integrating means are possible. For example, the integrating means can be charged by a charge-transfer technique such as described in our British Pat. Specification Nos. 1,058,501 and 1,067,734 (U.S. application Ser. Nos. 499,809 and 459,540, the latter application having been filed in the U.S. on May 28, 1965). This charge-transfer technique is particularly useful when a high rate of conversion is required.

Figure 2:
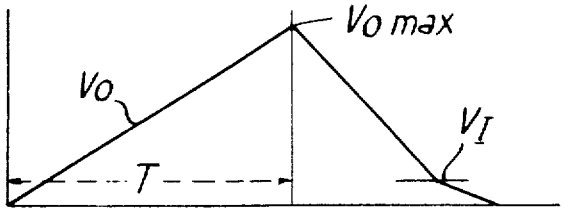
FIG. 2 shows a waveform illustrating the operation thereof.
Figure 7:
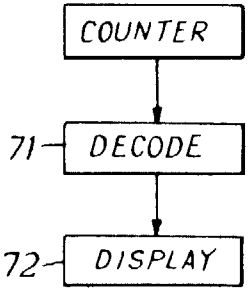
FIG. 7 shows a modification to convert the embodiments of FIGS. 1, 2 or 3 to an indicating digital voltmeter.

Any of the embodiments of FIGS. 1, 2 and 3 can be converted to an indicating digital voltmeter by the addition of a decode circuit 71 and a display device 72 as shown in FIG. 7.

I claim:

1. An analog-to-digital converter comprising an integrating means having an input and an output, means for applying an analog input signal to be converted to the input of the integrating means to drive the integrating means output from a datum level to a level dependent upon the magnitude of the input signal, a source of a reference signal, means for applying the reference signal to the input of the integrating means to drive the integrating means output to the datum level and thereby generate a ramp function, a counter, means for generating clock pulses, means for causing clock pulses to be counted by the counter during an interval commencing with the application of the reference signal, means for applying a first increment to the ramp function before the ramp reaches the datum level a first time, means for detecting when the ramp reaches the datum level, means for applying to the ramp function a second increment equal in magnitude but opposite in polarity to said first increment, and means for scaling down the reference signal and the numerical weighting with which the clock pulses are counted by a common factor, the means for applying the second increment and the means for scaling down the reference signal and the numerical weighting of the clock pulses being responsive to operation of said detecting means when the ramp reaches the datum level said first time, and said detecting means being operative to determine the count in the counter when the ramp reaches the datum level a second time, whereby the count in the counter when the ramp reaches the datum level said second time provides a digital representation of the analog signal magnitude.

2. A converter according to claim 1, wherein said first increment drives the integrating means output towards the datum [leve] *level*, and wherein said scaled-down reference signal is of the same polarity as the first mentioned reference signal and the clock pulses of reduced numerical weighting are counted additively.

3. A counter according to claim 1, wherein said first increment is applied to said ramp at substantially the commencement of the application of the reference signal.

4. A converter according to claim 1, wherein there is further provided means coupled to said counter for decoding and displaying the digital representation of the analog signal magnitude, and wherein said integrating means is a substantially linear integrator and a predetermined number of clock pulses are counted by said counter as the integrator output is driven from said datum level to said level dependent on said input signal.

* * * * *